United States Patent
Choquet et al.

(10) Patent No.: US 8,481,120 B2
(45) Date of Patent: Jul. 9, 2013

(54) METHOD FOR COATING A SUBSTRATE AND METAL ALLOY VACUUM DEPOSITION FACILITY

(75) Inventors: Patrick Choquet, Longeville les Metz (FR); Eric Silberberg, Haltinne (BE); Bruno Schmitz, Nandrin (BE); Daniel Chaleix, Verny (FR)

(73) Assignee: ArcelorMittal France, Saint Denis (FR)

( * ) Notice: Subject to any disclaimer, the term of this patent is extended or adjusted under 35 U.S.C. 154(b) by 335 days.

(21) Appl. No.: 12/532,043

(22) PCT Filed: Mar. 19, 2008

(86) PCT No.: PCT/FR2008/000347
§ 371 (c)(1),
(2), (4) Date: Dec. 31, 2009

(87) PCT Pub. No.: WO2008/142222
PCT Pub. Date: Nov. 27, 2008

(65) Prior Publication Data
US 2010/0104752 A1    Apr. 29, 2010

(30) Foreign Application Priority Data
Mar. 20, 2007   (EP) ................... 07290342

(51) Int. Cl.
*B05D 3/00* (2006.01)
*C23C 16/00* (2006.01)

(52) U.S. Cl.
USPC ........... 427/251; 427/250; 427/327; 427/328; 118/715; 118/718; 118/726; 118/620

(58) Field of Classification Search
USPC ................... 427/248.1, 250, 255.5
See application file for complete search history.

(56) References Cited

U.S. PATENT DOCUMENTS

| | | | |
|---|---|---|---|
| 3,467,058 A * | 9/1969 | Box et al. | 118/726 |
| 4,587,134 A * | 5/1986 | Shimozato et al. | 427/10 |
| 5,002,837 A * | 3/1991 | Shimogori et al. | 428/621 |
| 6,309,508 B1 * | 10/2001 | Lemme et al. | 159/49 |
| 2004/0022942 A1 * | 2/2004 | Schade van Westrum et al. | 427/248.1 |

FOREIGN PATENT DOCUMENTS

| | | |
|---|---|---|
| BE | 1 010 720 | 12/1998 |
| EP | 1 174 526 | 1/2002 |
| FR | 1031996 | 6/1953 |
| JP | 59177370 A * | 10/1984 |
| JP | 9 256157 | 9/1997 |
| JP | 11 279670 | 10/1999 |
| WO | WO 9747782 A1 * | 12/1997 |

OTHER PUBLICATIONS

Computer Translation of WO 9747782 A1.*
Schmitz, Bruno. Development of Zn-Mg alloy coatings by JVD, Steel Research 72 (2001) No. 11/12. pp. 1-8.*

* cited by examiner

*Primary Examiner* — David Turocy
(74) *Attorney, Agent, or Firm* — Davidson, Davidson & Kappel, LLC

(57) ABSTRACT

The invention relates to a process for coating a substrate (S) whereby a metal alloy layer comprising at least two metallic elements is continuously deposited on the substrate (S) by means of a vacuum deposition facility (1) comprising a vapor jet coater (7) for spraying the substrate (S) with a vapor containing the metallic elements in a constant and predetermined relative content, the vapor being sprayed at a sonic velocity. The process is more particularly intended for depositing Zn—Mg coatings.
The invention also relates to a vacuum deposition facility (1) for continuously depositing coatings formed from metal alloys, for implementing the process.

8 Claims, 3 Drawing Sheets

METHOD FOR COATING A SUBSTRATE AND METAL ALLOY VACUUM DEPOSITION FACILITY

The present invention relates to a process for continuously coating a substrate and to a vacuum deposition facility for coatings formed from metal alloys, such as for example zinc-magnesium alloys, said process being more particularly intended for coating steel strip, without in any way being limited thereto.

Various processes for depositing metal coatings composed of alloys on a substrate, such as a steel strip, are known. Among these, mention may be made of hot-dip coating, electrodeposition and also the various vacuum deposition processes, such as vacuum evaporation and magnetron sputtering.

Thus, a vacuum evaporation process, described in WO 02/06558 is known that consists in coevaporating two elements in a chamber so as to mix the vapor of the two elements together before coating the substrate.

However, industrial implementation of this process is difficult and is not conceivable for production that must guarantee a stable coating composition over long substrate lengths.

It is also possible for a layer of each of the constituent elements of the alloy to be deposited in succession on the substrate and then to carry out a diffusion heat treatment resulting in the formation of an alloyed layer having the most homogeneous composition possible. Thus, in particular zinc-magnesium coatings may be produced which may advantageously be used instead of coatings of pure zinc or other zinc alloys.

This successive deposition of each of the elements may in particular be carried out by vacuum co-evaporation of each element placed in a separate crucible, as described in EP 730 045, but also by vacuum deposition of an element on a strip precoated with another element by a conventional hot-dip process.

However, the subsequent diffusion heat treatment may prove to be complicated and expensive as it involves the use of large quantities of inerting gas in order to prevent any oxidation of the coating at high temperature during the heat treatment. Furthermore, to avoid any risk of oxidation between the magnesium coating and the start of the diffusion treatment, it is necessary to perform the two operations one immediately after the other, without exposing the strip to the open air.

This heat treatment may also pose problems in the case of certain materials that are not compatible with an excessively large temperature rise. Mention may in particular be made of bake-hardening steel strip which contains large amounts of carbon in solid solution, which must not precipitate before the strip has been formed by the user of the material.

Moreover, in this type of process, it is very tricky to obtain a coating of constant composition over a long substrate length as it is necessary for the thicknesses of each layer to be very precisely controlled over the course of time.

Finally, the diffusion treatment does admittedly allow the alloy to form, but it may also lead to the diffusion of elements from the substrate to the coating, thus contaminating the interface with the substrate.

The aim of the present invention is therefore to remedy the drawbacks of the processes and facilities of the prior art by providing a vacuum deposition facility for depositing coatings formed from metal alloys and a process for manufacturing a metal strip covered with a metal alloy layer, which allow simple industrial implementation, in few steps, but which also allow a coating of constant composition to be obtained, on various types of substrates.

For this purpose, a first subject of the present invention consists of a process for coating a substrate, whereby a metal alloy layer comprising at least two metallic elements is continuously deposited on said substrate by means of a vacuum deposition facility comprising a vapor jet coater for spraying the substrate, at a sonic velocity, with a vapor containing said at least two metallic elements in a constant and predetermined relative content, said vapor being obtained by evaporating a metal alloy bath containing said metallic elements in a predetermined initial content, said initial content of the bath being kept constant during the deposition.

The process according to the invention may also comprise various features, taken by themselves or in combination, as follows:
- the metallic elements are zinc and magnesium;
- the metal alloy layer contains no iron-zinc intermetallic phases;
- the metal alloy layer predominantly consists of a $Zn_2Mg$ phase;
- a layer of a zinc-based metal alloy having a predetermined magnesium content of between 4% and 20% by weight is continuously deposited on the substrate by evaporating a bath of a zinc-based metal alloy initially having a predetermined magnesium content of between 30% and 55% by weight of magnesium, the initial content being kept constant during the deposition;
- a layer of a zinc-based metal alloy having a predetermined magnesium content of between 4% and 18% by weight is continuously deposited on the substrate by evaporating a bath of a zinc-based metal alloy initially having a predetermined magnesium content of between 30% and 50% by weight of magnesium, the initial content being kept constant during the deposition;
- the metallic elements have evaporation temperatures differing by no more than 100° C. at the selected evaporation pressure;
- a metal alloy layer is deposited with a thickness of between 0.1 and 20 μm;
- the substrate is a metal strip and preferably a steel strip;
- the metal strip is made of a bake-hardening steel; and
- the metal alloy layer consists predominantly of a $Zn_2Mg$ phase.

A second subject of the invention consists of a vacuum deposition facility for continuously depositing coatings formed from metal alloys comprising at least two metallic elements on a running substrate, comprising a vacuum deposition chamber and means for running the substrate through this chamber, the facility further comprising:
- a sonic vapor jet coater;
- means for feeding said coater with vapor comprising said at least two metallic elements in a predetermined and constant ratio;
- means for evaporating a bath of metal alloy comprising said metallic elements, which will feed said coater; and
- means for adjusting the composition of the metal alloy bath, enabling it to be kept constant over the course of time.

The facility according to the invention may also comprise the following variants, taken in isolation or in combination:
- the means for adjusting the composition of the metal alloy bath comprise means for feeding the evaporation means with a molten metal alloy of controlled composition;
- the evaporation means consist of an evaporation crucible provided with heating means and said means for feeding said evaporation crucible with a molten metal alloy of controlled composition comprise a recharging furnace which is connected to metal ingot feed means and is provided with a heating system, said recharging furnace being connected to the evaporation crucible that it feeds;

the facility further includes means for continuously circulating the bath, in the form of a recirculation pipe connecting the evaporation crucible to the recharging furnace;

the evaporation crucible is placed in the vacuum chamber and the recharging furnace is placed outside the vacuum chamber;

the recharging furnace and the evaporation crucible are placed side by side and have a common wall pierced by at least one opening located beneath the level of the metal alloy bath but above the bottom of the furnace and of the crucible; and the evaporation crucible is placed in a confined chamber and the recharging furnace is placed outside the confined chamber.

A third subject of the invention consists of an ingot based on zinc containing 30 to 55% magnesium by weight, preferably 30 to 50% magnesium by weight, and able to be used for implementing the process according to the invention or in a facility according to the invention.

The invention consists in depositing a metal alloy of given composition on a substrate by a sonic vapor jet coating process.

Thanks to the pressure difference created between a closed evaporation crucible and the deposition chamber, it is possible to generate, through a narrow slot, a metal vapor jet of possibly sonic velocity. The reader may refer to the patent WO 97/47782 for a fuller description of the details of this type of device.

The vapor feeding the JVD (Jet Vapor Deposition) device comes from the direct vacuum evaporation of a bath of the alloy itself, the composition of the bath being kept constant over the course of time.

Now, taking the example of a zinc-based alloy containing magnesium, each of these two elements has a different vapor pressure. The composition of the layer deposited will therefore not be the same as that of the ingot used as raw material for the evaporation. Thus, as may be seen in FIG. 1, which shows the magnesium content in wt % in the coating plotted on the y-axis as a function of the magnesium content in wt % in the bath plotted on the x-axis, to obtain a magnesium content of 16% in the coating it is necessary to have 48% magnesium in the metal bath.

Because of this difference in the vapor pressures of the alloy elements, the composition of the alloy bath used for the evaporation and, in fact, the corresponding vapor flux will vary over the course of time, with in the case of zinc-magnesium a progressive enrichment with magnesium.

To keep the composition of the evaporation flux constant over the course of time, it is necessary to provide a device enabling the composition of the bath to be kept constant if it is desired to be able to deposit this type of coating in the context of industrial implementation.

Other features and advantages of the invention will become apparent on reading the following detailed description given solely by way of example, with reference to the appended figures in which.

The description that follows will refer to a coating of a zinc alloy containing magnesium, but it is quite obvious that the facility according to the invention is not limited thereto and that it is possible to deposit many other coatings based on metal alloys.

Figure 1:
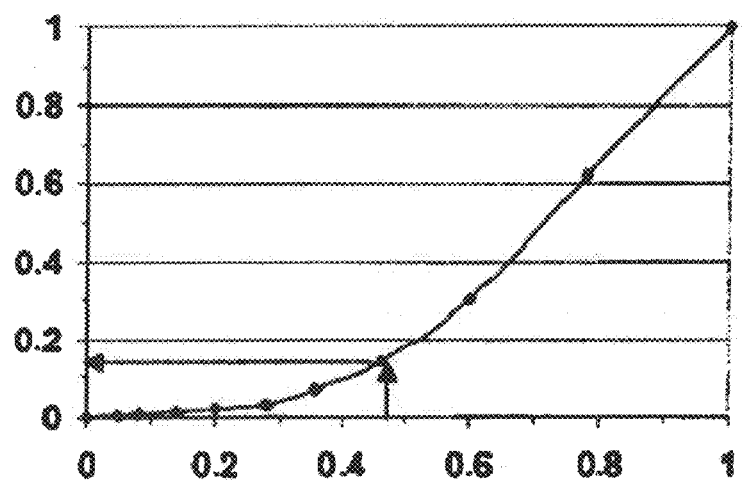
FIG. 1 shows the magnesium content in wt % in a ZnMg coating as a function of the magnesium content in wt % in the liquid metal bath before evaporation.
Figure 2:
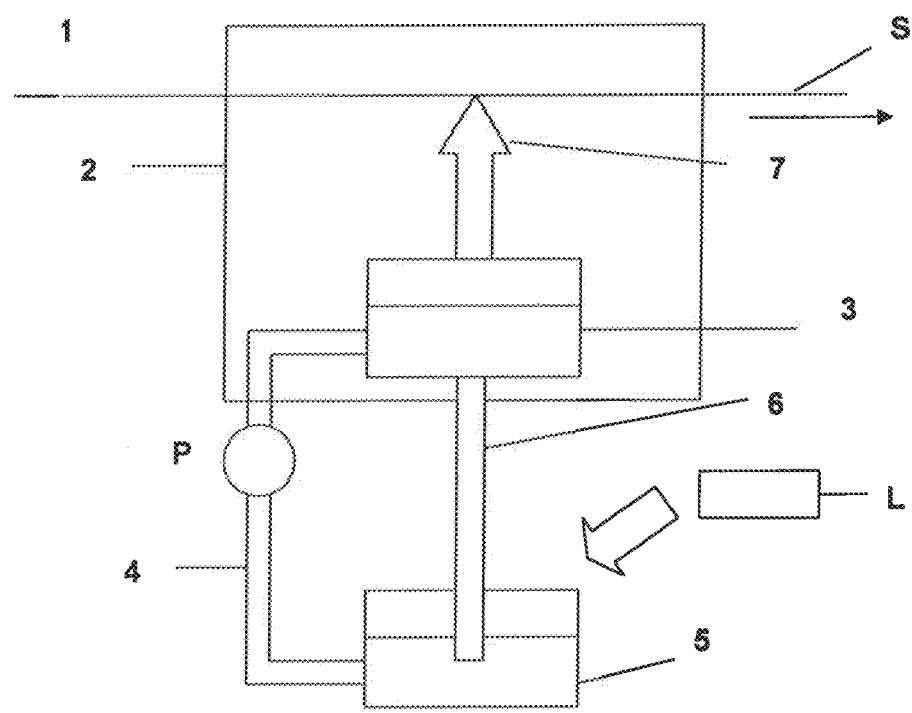
FIG. 2 shows a first embodiment of a facility according to the invention.

A first embodiment of a facility according to the invention is shown more particularly in FIG. 2, which shows a facility 1 comprising a vacuum deposition chamber 2. This chamber 2 is preferably kept at a pressure of between $10^{-8}$ and $10^{-4}$ bar. It has an entry load-lock and a exit load-lock is (these not being shown) between which a substrate S, such as for example a steel strip, runs.

The substrate S may be made to run by any suitable means, depending on the nature and the shape of said substrate. A rotary support roller on which a steel strip can bear may in particular be used.

Placed opposite the face of the substrate S which has to be coated there is a small extraction chamber 7 provided with a narrow slot, the length of which is close to the width of the substrate to be coated. This chamber may for example be made of graphite and may be mounted, directly or otherwise, on an evaporation crucible 3 that contains the liquid metal to be deposited on the substrate S. The evaporation crucible 3 is continuously recharged with liquid metal via a pipe 4 connected to a melting furnace 5 which is placed beneath the extraction chamber 7 and is at atmospheric pressure. An overflow pipe 6 also connects the evaporation crucible 3 directly to the recharging furnace 5. The elements 3, 4, 5 and 6 are heated to temperatures high enough for the metal vapor not to condense or the metal not to solidify on their respective walls.

The evaporation crucible 3 and the liquid metal recharging furnace 5 are advantageously provided with an induction heater (not shown) which has the advantage of making the stirring and the composition homogenization of the metal alloy bath easier.

When it is desired to operate the facility 1, the composition of the metal alloy that it is desired to deposit on the substrate is firstly determined and then the composition of the bath for obtaining, in equilibrium with this bath, a vapor having the composition of the intended coating is determined. Ingots L of a metal alloy having this precise composition are produced, and are then introduced continuously into the recharging furnace 5.

Once the ingots L have melted, the evaporation crucible 3 and the pipe 6 are heated and then a vacuum is created in the evaporation crucible 3. The liquid metal contained in the recharging furnace 5 then fills the evaporation crucible 3. During the operation of the device, a constant level of liquid metal is maintained in the evaporation crucible 3 by adjusting the height between the evaporation crucible 3 and the recharging furnace 5, or by activating a liquid metal pump P. A circulating pump (not shown) installed on the overflow 6 makes it possible to permanently replenish the liquid metal in the evaporation crucible 3 so as to minimize the accumulation of impurities which, after a certain time, would greatly reduce the rate of evaporation of the metal.

The bath is thus continuously replenished and therefore always has the required composition at any point, while still minimizing the amount of material needed to coat the substrate.

The evaporation crucible 3 is itself provided with heating means enabling the vapor to form and to feed a JVD coater consisting of the extraction chamber 7, which sprays a sonic vapor jet onto the running substrate S.

Surprisingly, it has been found that spraying a sonic metal vapor jet onto a substrate makes it possible to obtain a coating of an AB alloy with nanoscale mixing of the elements A and B. This result is extremely important in terms of corrosion resistance as, in this case, no micro-cell can form on the surface of the AB alloy coating when this is in contact with liquid condensates.

The sonic jet outlet orifice may have any suitable shape, such as a slot that can range of evaporated be adjusted lengthwise and widthwise for example. This process thus makes it possible for the width of the vapor outlet orifice to be easily adapted so as to maintain a sonic jet within a wide range of evaporated metal surface temperatures and therefore a wide range of evaporation rates. Furthermore, the possibility of adapting its length to the width of the substrate to be coated makes it possible to minimize the loss of evaporated metal.

Figure 3:
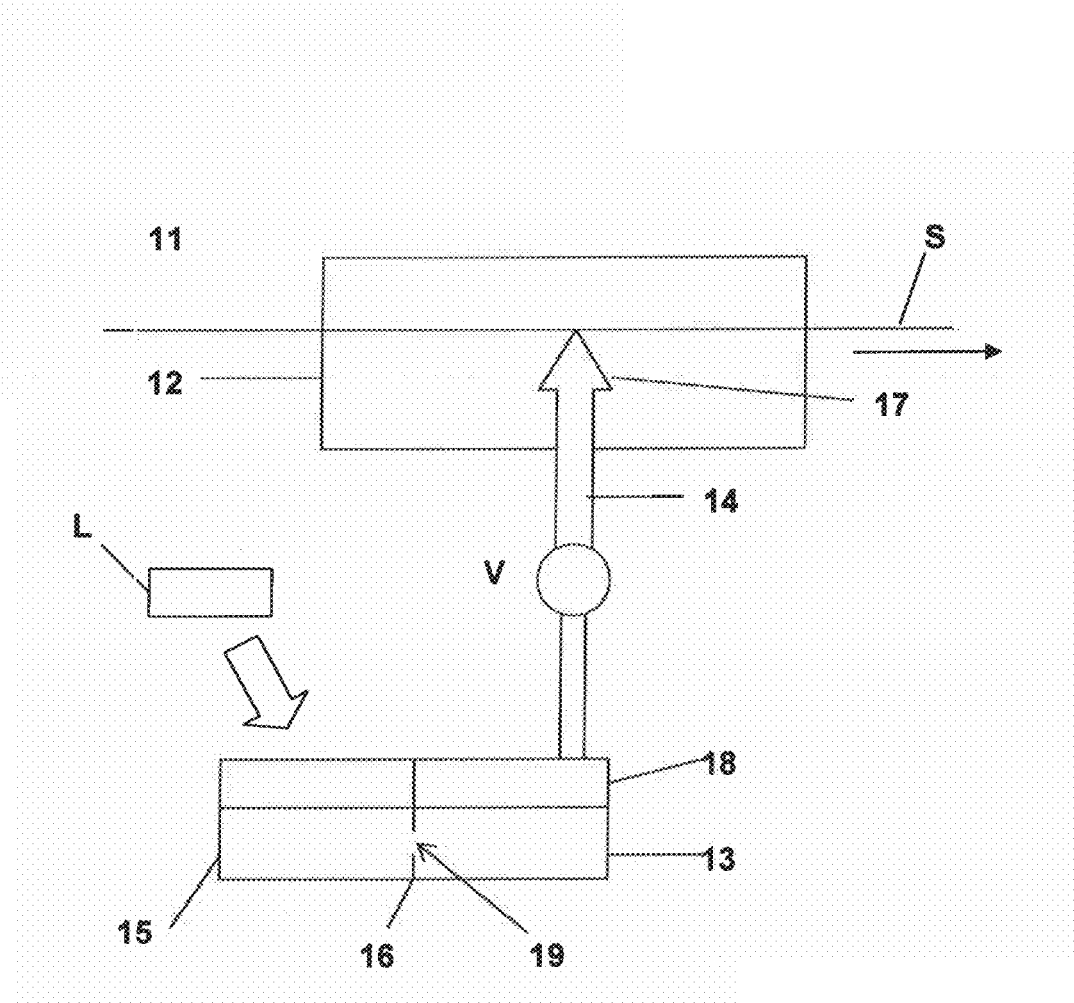
FIG. 3 shows a second embodiment of a facility according to the invention.

In a second embodiment as shown in FIG. 3, a facility 11 comprises a vacuum deposition chamber 12 similar to the chamber 2. An evaporation crucible 13 is placed under the vacuum chamber 12 and is connected via a pipe 14 thereto.

A recharging furnace 15 is placed alongside the evaporation crucible 13, the two components sharing a common wall 16 pierced by a communication is opening 19 placed below the level of the metal alloy bath but above the bottom of these components so as to prevent any impurities that settle at the bottom of the recharging furnace 15 from being introduced into the evaporation crucible 13.

The evaporation crucible 13 is moreover placed in a confined chamber 18, placed outside the vacuum chamber 12.

The pipe 14 feeds a JVD coater 17, similar to the coater 7.

In the same way as previously, the composition of the coating which it is desired to obtain on the substrate is firstly determined and then deduced from this is the composition of the metal bath that has to be present in the evaporation crucible 13, and therefore the composition of the metal ingots L with which the recharging furnace 15 has to be fed.

The ingots are placed in the recharging furnace 15, which is provided with an induction heating system. As they melt, the metal alloy passes from the recharging furnace 15 to the evaporation crucible 13 via the opening 19. The evaporation crucible 13 is itself provided with an induction heating system that enables a metal alloy vapor having the required composition to be generated. This vapor is then conveyed to the JVD coater 17 via the pipe 14, which is advantageously provided with a valve V for regulating the vapor flow rate.

Having a communication opening 19 between the recharging furnace is and the evaporation crucible 13 it is possible to feed the evaporation crucible 13 but also to provide a constant circulation between these two components, thereby ensuring that a constant composition is maintained at all points in the bath contained by the evaporation crucible 13.

The process according to the invention applies more particularly, but not solely, to the treatment of metal strips, whether precoated or bare. Of course, the process according to the invention may be employed for any coated or uncoated substrate, such as for example aluminum strip, glass strip or ceramic strip.

The process will more particularly be applied to substrates liable to suffer a deterioration in their properties during a diffusion heat treatment, such as bake-hardening steel strip that contains large amounts of carbon in solid solution, which must not precipitate before the steel has been formed by drawing or any other suitable process. By implementing the process according to the invention it thus makes it possible to make metal alloy deposition compatible with most metallurgies.

The aim is in particular to obtain zinc-magnesium coatings. However, the process is not limited to these coatings, but preferably encompasses any coating based on a metal alloy the elements of which have evaporation temperatures not differing by more than 100° C., as controlling their respective relative content is then facilitated.

To give an indication, mention may thus be made of coatings made of zinc and other elements, such as chromium, nickel, titanium, manganese and aluminum.

Moreover, although the process and the facility according to the invention are more particularly intended for the deposition of binary metal alloys, it goes without saying that they can be adapted to the deposition of ternary metal alloys, such as Zn—Mg—Al, or even the deposition of quaternary alloys, such as for example Zn—Mg—Al—Si.

In the case of zinc-magnesium deposition, the thickness of the coating will preferably be between 0.1 and 20 μm. This is because below 0.1 μm, there would be a risk that the corrosion protection of the substrate would be insufficient. The coating thickness does not exceed 20 μm as it is unnecessary to go beyond this thickness in order to have a level of corrosion resistance which is required, in particular, in the automotive or construction field. In general, the thickness may be limited to 5 μm for automotive applications.

Figure 4:
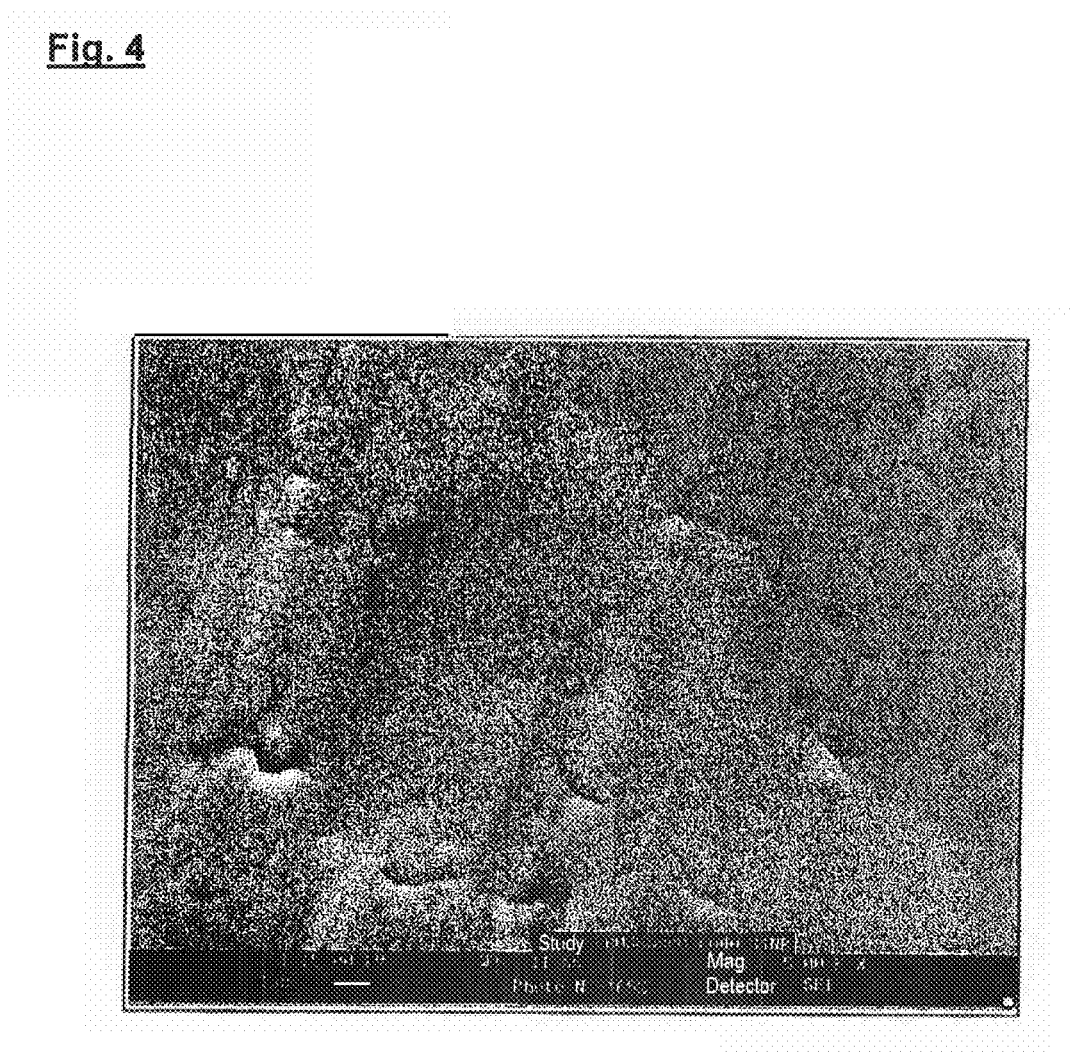
FIG. 4 shows the microstructure of a 5 µm coating of ZnMg alloy deposited on a cold-rolled low-carbon steel.

By carrying out industrial trials it has been shown that deposition by this process makes it possible to achieve a high deposition rate of 5 μm ZnMg alloy coating that can be deposited on a line running at 10 m/min, with a material yield greater than 98% thanks to the targeted orientation of the jet. Furthermore, the density of the coating layers obtained is excellent, due to a higher vapor energy. FIG. 4 thus shows the microstructure of a 5 μm ZnMg alloy coating deposited on a cold-rolled low-carbon steel.

The invention claimed is:

1. A process for coating a substrate, comprising:
   (i) evaporating, via an evaporator, a metal alloy bath comprising at least two metallic elements,
   (ii) spraying the substrate, at a sonic velocity, with a vapor comprising said at least two metallic elements in a constant and predetermined relative content, and
   (iii) continuously depositing a metal alloy layer comprising said at least two metallic elements on said substrate by a vacuum deposition facility comprising a vapor jet coater carrying out (ii),
   wherein
   the evaporator consists of an evaporation crucible comprising an induction heater, an initial content of the bath is kept constant during the deposition, the composition of the metal alloy bath is homogeneous and kept constant at all points in the bath,
   said metal alloy layer consists essentially of a $Zn_2Mg$ phase and has a magnesium content between 4% and 18% by weight, and
   said metal alloy bath has a magnesium content between 30% and 50% by weight.

2. The process as claimed in claim 1, wherein said metallic elements are zinc and magnesium.

3. The process according to claim 2, wherein said metal alloy layer comprises no iron-zinc intermetallic phases.

4. The procesfor coating a substrate according to claim 1, wherein a difference between evaporation temperatures of said metallic elements is not more than 100° C. at the selected evaporation pressure.

5. The process according to claim 1, comprising depositing a metal alloy layer with a thickness of between 0.1 and 20 μm.

6. The process according to claim 1, wherein said substrate is a metal strip.

7. The process according to claim 6, wherein said metal strip is made of a bake-hardening steel.

8. The process according to claim 1, wherein the metal alloy bath is obtained from an ingot comprising zinc and 30 to 50% magnesium by weight.

* * * * *